(12) United States Patent
Kopp

(10) Patent No.: US 7,010,631 B2
(45) Date of Patent: Mar. 7, 2006

(54) CONTROLLER BASED HARDWARE DEVICE AND METHOD FOR SETTING THE SAME

(75) Inventor: Nicholas C. Kopp, Delft (NL)

(73) Assignee: Eonic B.V., (NL)

(*) Notice: Subject to any disclaimer, the term of this patent is extended or adjusted under 35 U.S.C. 154(b) by 44 days.

(21) Appl. No.: 10/498,193

(22) PCT Filed: Dec. 11, 2002

(86) PCT No.: PCT/NL02/00814

§ 371 (c)(1),
(2), (4) Date: Jun. 9, 2004

(87) PCT Pub. No.: WO03/060535

PCT Pub. Date: Jul. 24, 2003

(65) Prior Publication Data

US 2005/0080957 A1    Apr. 14, 2005

(30) Foreign Application Priority Data

Dec. 11, 2001 (NL) .................................. 1019533

(51) Int. Cl.
*G06F 13/00* (2006.01)
(52) U.S. Cl. .................... 710/104; 710/100; 716/16
(58) Field of Classification Search ................ 710/104, 710/100, 72–74; 711/100, 168; 712/25, 712/208; 718/100–102; 709/238, 250; 370/464, 370/383; 716/16
See application file for complete search history.

(56) References Cited

U.S. PATENT DOCUMENTS

| | | | | |
|---|---|---|---|---|
| 4,972,314 A | * | 11/1990 | Getzinger et al. | 711/149 |
| 5,081,297 A | | 1/1992 | Lebel et al. | |
| 5,303,344 A | * | 4/1994 | Yokoyama et al. | 709/230 |
| 5,615,135 A | * | 3/1997 | Waclawsky et al. | 702/182 |
| 5,819,050 A | * | 10/1998 | Boehling et al. | 710/104 |
| 6,188,803 B1 | * | 2/2001 | Iwase et al. | 382/300 |
| 6,223,181 B1 | * | 4/2001 | Goldberg et al. | 707/101 |
| 6,922,359 B1 | * | 7/2005 | Ooishi | 365/185.16 |

OTHER PUBLICATIONS

"On the design of a high-performance adaptive router for CC-NUMA multiprocessors" by Puente et al.(abstract only) □□Publication Date: May 2003□□.*

* cited by examiner

*Primary Examiner*—Gopal C. Ray
(74) *Attorney, Agent, or Firm*—The Webb Law Firm

(57) ABSTRACT

A controller based hardware device includes a controller node for each of a plurality of hardware elements, and a control instruction decoder. The control instruction decoder is arranged for receiving control data for a specific one of the hardware elements and communicating that control data to the associated hardware element. The control data includes at least one control vector, which includes at least one command line and an indication of the scheduling of the command lines. The command line includes at least one operation which may be executed in parallel on the controller based hardware. The operation includes a description of data flow between selected one of the hardware elements.

15 Claims, 2 Drawing Sheets

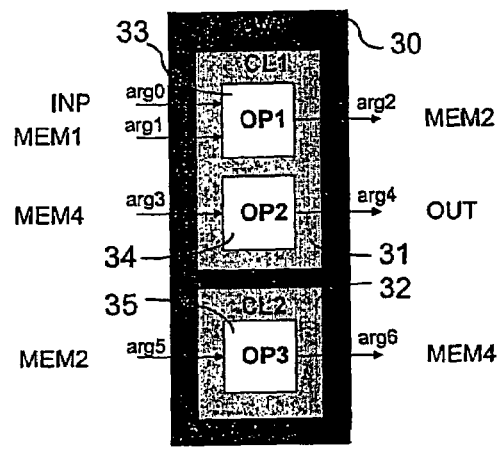
*Fig 2*
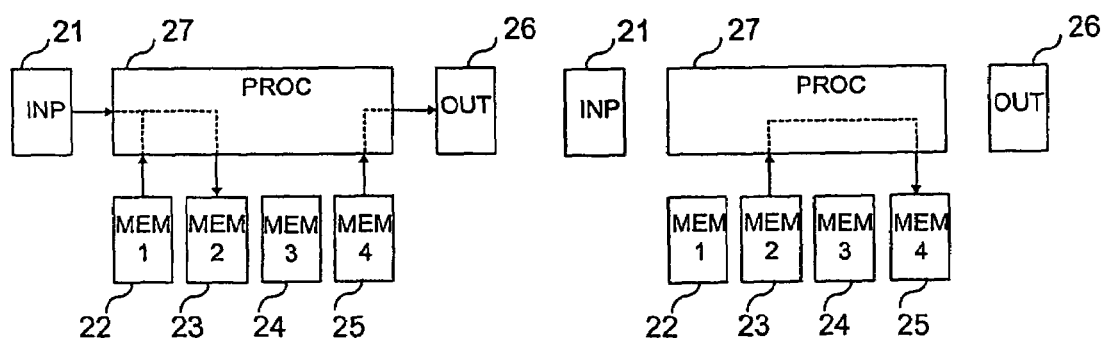
*Fig 3A*        *Fig 3B*

CONTROLLER BASED HARDWARE DEVICE AND METHOD FOR SETTING THE SAME

BACKGROUND OF THE INVENTION

1. Field of the Invention

The present invention relates to a method for setting controller based hardware comprising a plurality of hardware elements and in a further aspect to a controller based hardware device comprising a plurality of hardware elements.

2. Description of Related Art

U.S. Pat. No. 5,081,297 describes a re-configurable signal processing device including a plurality of programmable modules that are re-configurable to perform one of a plurality of selected signal processing functions, such as a time base generator, counter, accumulator, address register, delay circuit, timer. The modules are selectively reconfigured and interconnected by a configuration and control circuit receiving command and control signals from a host processor containing the control software. The programmable modules comprise re-configurable gate arrays.

However, the device as described in U.S. Pat. No. 5,081,297 is very strict with respect to input and output data, and the programmable modules are restricted to performing signal processing functions.

Hardware processors may have a fixed or flexible architecture. A fixed architecture provides a very high performance (speed or data throughput) but is restricted to performing a single algorithm. It is known to use Field Programmable Gate Array's (FPGA) to allow some degree of flexibility, but each different algorithm would require a reprogramming of the FPGA's. Flexible architectures are known using Digital Signal Processors (DSP), but these usually have a lower performance.

The present invention seeks to provide an efficient method and device for controller based hardware, which is an efficient compromise between flexibility of digital signal processors and performance of fixed solutions.

SUMMARY OF THE INVENTION

According to a first aspect of the present invention, a method is provided for setting controller based hardware comprising a plurality of hardware elements, the method comprising the steps of receiving control data for a specific one of the hardware elements and communicating that control data to the associated hardware element; the control data comprising at least one control vector, the at least one control vector comprising at least one command line and an indication of the scheduling of the at least one command line, the at least one command line comprising at least one operation which may be executed in parallel on the controller based hardware, and the at least one operation comprising a description of data flow between selected ones of the hardware elements.

This method allows to set parameters for any data driven controller based hardware system in a very efficient and easy way, and provides for an efficient compromise between flexibility of programmable systems and the performance of fixed systems. The method may be implemented using a text based editor and a compiler for achieving powerful, flexible, clear and straightforward use of a controller based hardware device. Although the user must have knowledge of the hardware architecture, this is not difficult to obtain. Furthermore, the compiler may give informative warnings and errors to aid the user. By using the present method, usual traps in programming re-configurable hardware, such as deadlocks, incorrect transfer sequences, may be prevented.

The hardware element may comprise one or more of the type of input element, output element, read and/or write accessible memory element, processing element. The operation can than comprise simple mathematical like formulas for describing a desired processing step.

In a further embodiment, the control data further comprises a data argument list for the at least one control vector, the data argument list comprising data parameters for the at least one operation. The data parameters may comprise one or more of the following type of data: data format, number of data samples, data length, address location. In this embodiment, also the properties of the data to be transferred or processed is included in the programming of the controller based hardware, allowing to set the hardware elements in the proper manner to efficiently carry out its function.

In a further embodiment, each of the plurality of hardware elements is controllable as a source element for outputting data, a sink element for receiving data, a processing element for processing data or as an idle element. This allows to dynamically control all hardware elements of a controller based hardware device. Some hardware elements (e.g. memory) may be a source element in one instance, and a sink element the next instance.

A control vector may be repeated after receiving a predetermined repeat code, e.g. an 8 byte word with all zero's in place of an expected control vector. This allows to shorten the necessary text file for setting the controller based hardware.

In a further embodiment, the control data comprising a transferlet, the transferlet comprising a plurality of control vectors and associated data argument lists. The transferlet is especially suited to program an environment in which data flow is to be achieved from a first group of controller nodes to a second group. The transferlets form linked list transfers based on the control vectors and the inputs and outputs that these contain.

In a further aspect of the present invention, a controller based hardware device comprises a plurality of hardware elements, and further comprises a controller node for each of the plurality of hardware elements for controlling the associated hardware element, and a control instruction decoder, the control instruction decoder being arranged for receiving control data for a specific one of the hardware elements and communicating that control data to the associated hardware element, the control data comprising at least one control vector, the at least one control vector comprising at least one command line and an indication of the scheduling of the at least one command line, the at least one command line comprising at least one operation which may be executed in parallel on the controller based hardware and the at least one operation comprising a description of data flow between selected ones of the hardware elements.

The control instruction decoder allows to set the controller nodes associated with hardware elements using the effective and efficient method as described above.

In a further embodiment of the present invention, the control instruction decoder and controller node are implemented in at least one field programmable gate array. This allows to keep a very highly integrated controller based hardware device, as it only requires one additional hardware element to be positioned on the controller based hardware device.

Further advantageous embodiments are described in the dependent claims.

BRIEF DESCRIPTION OF THE DRAWINGS

The present invention will now be explained in more detail using a number of exemplary embodiments, with reference to the accompanying drawings, in which:

FIG. 2 shows a schematic view of the control vector arrangement according to the present invention; and FIGS. 3A and B show in a diagrammatic view the data flow between various hardware elements of the embodiment of FIG. 1.

DESCRIPTION OF THE PREFERRED EMBODIMENTS

Figure 1:
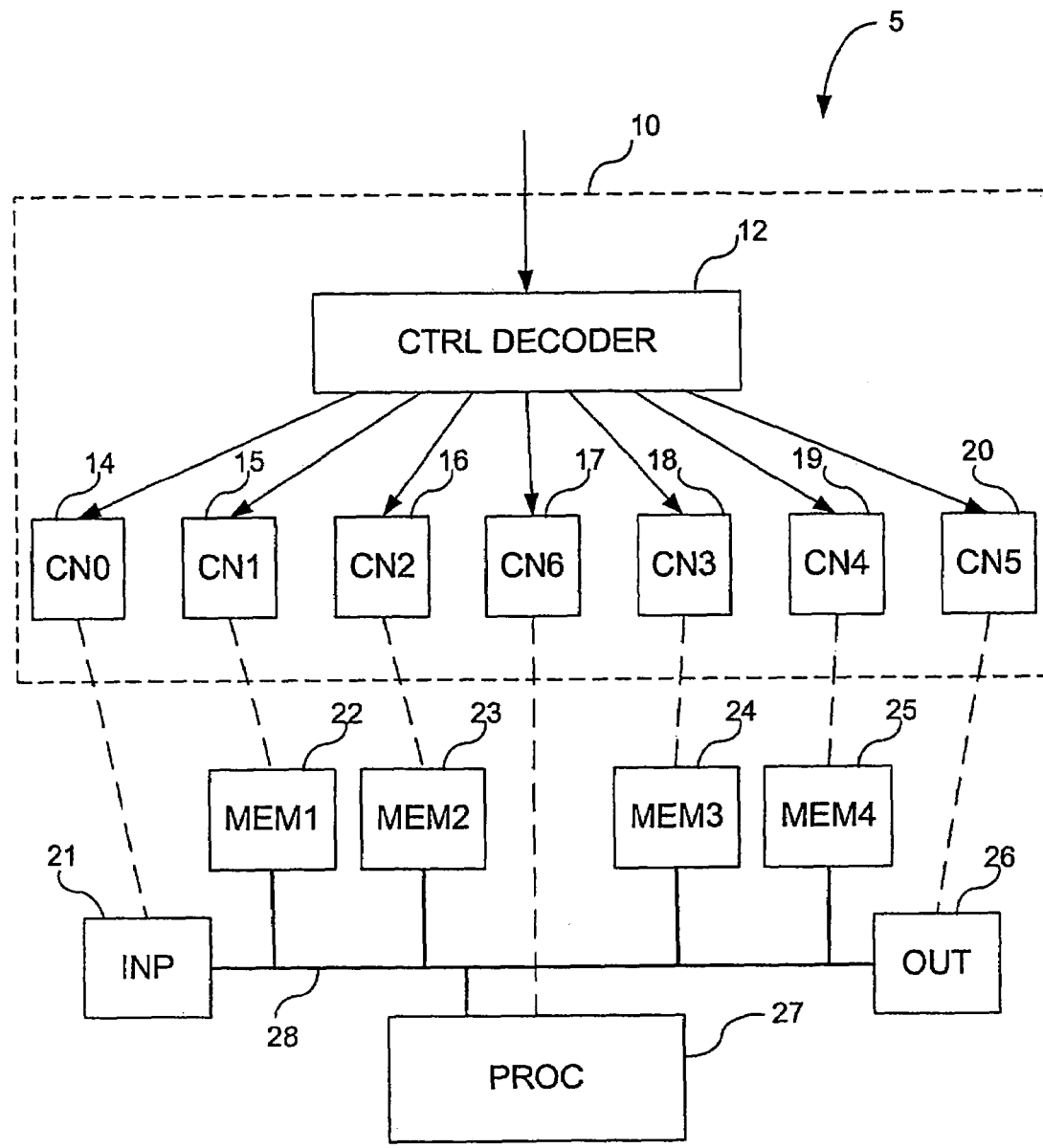
FIG. 1 shows a schematic diagram of an exemplary embodiment of controller based hardware in which the present invention is used.

In FIG. 1 a schematic view is shown of a hardware device or board 5 comprising a number of hardware elements 21 through 27, interconnected with each other via a network or bus structure 28. In the embodiment shown, the element 27 is a processor (PROC), which can receive, process and output data. The element 21 is a source type element in the form of an input interface (INP) to the board 5. The element 26 is a sink type element in the form of an output interface (OUT) to the board 5. The elements 22 through 25 are sink or source type elements in the form of read and write accessible memory devices (MEM1–MEM4). In general, the hardware elements 21–27 may be any kind of sink, source or processing element, such as an input element, output element, memory element, processing element.

With each hardware element 21–27, a controller node CN0–CN6 (also indicated with reference numerals 14–20) is associated. The controller nodes 14–20 are connected to the respective elements 21–27 to communicate settings for the respective hardware elements 21–27. This is implemented using a control instruction decoder 12, which receives configuration instructions from an outside source, such as a host computer (not shown) or another input device.

A controller node CN0–CN6 can be in one of the following states:

Source: The controller node CN0–CN6 operates as an input controller for data. An example of a controller node in a "source" state is the input 21 to a coprocessor board (e.g. board 5). Memory banks (e.g. MEM1–MEM4) when being read from are also examples of sources.

Sinks: The controller node operates as an output controller for data. An example of a controller node in a "sink" state is the output 26 from the coprocessor board 5. Memory banks when being written to are also examples of sinks.

Process: The controller node operates as a controller for data processing. It gets data from one or more sources, processes the data, and outputs to one or more sinks. A process can be a controller for a chip, a piece of software on a DSP, etc.

Idle: The controller node is in "idle" state. A controller node is in an "idle" state when it is not being used within the current operations.

The state of an entire network of controller nodes (such as the network of CN0–CN6) is described by the states of the controller nodes and by the interconnects of the hardware elements 21–27 under control of the controller nodes CN0–CN6.

The control instruction decoder 12 and controller nodes CN0–CN6 may be implemented using a single Field Programmable Gate Array (FPGA) 10, which may be included on the same hardware board 5 as the hardware elements 21–27.

The control instruction decoder 12 receives a list with setting commands in the form of one or more control vectors. The control instruction decoder 12 is arranged to extract the settings for each of the controller nodes CN0–CN6 from this list, and to distribute the respective settings to the proper controller node CN0–CN6.

E.g., for the controller node CN1, which is associated with the memory device 22 (MEM1) of the hardware board, which is formed by (part of) an FPGA 10, the settings include what action is to be expected (read or write data), where the data can be found (begin address), how much data is accessed (data length) and what the source and destination of the data is. This allows the controller node CN1 to access the memory MEM1 and to establish a data path to the source or destination of the data. The other controller nodes involved in the same command will also receive their settings and will be programmed to perform the desired function.

An example of controller based hardware using the present invention is a FFT engine, of which the architecture is depicted in FIG. 1. The FFT engine comprises controllers for input 21, output 26, four memory banks 22–25 and a core processing chip 27, which can perform FFT related functions. Data can be pictured as flowing between or through the controllers 14–20 associated with the respective hardware elements 21–27. For example, to load data to the first memory bank 22, the input controller CN0 14 must know how much data of a particular format to expect and whether to perform any reshaping operations on this data. The first memory bank controller CN1 15 must then know how much data to expect, where to put it and in which direction to write it (horizontally or vertically). The settings for the input and memory controllers 14, 15 must be congruent in data quantity or else a deadlock will result. The present method provides a frame work for consistent setting of controller nodes and automatically making and checking settings where possible.

FIG. 2 shows a hierarchical lay-out of the present method for setting controller based hardware. The lowest level settings are formed by operations 33, 34, 35 (OP1–OP3), which may be grouped into command lines 31, 32 (CL1–CL2). Command lines may be grouped into command vectors 30 (CV1). The operations receive data from sources (some of the hardware elements 21–27, indicated in FIG. 2 by the corresponding mnemonics of FIG. 1) as well as arguments (arg0, arg1, arg3, arg5) associated with the data. The output of operations is sent to sink elements (other hardware elements 21–27) with associated arguments (arg2, arg4, arg6). In the following, the present method will be explained in further detail.

Instructions describing data flow which can be performed simultaneously (or in parallel) can be grouped in command lines 31, 32. Within a group (or command line 31, 32) multiple references to the same controller CN0 . . . CN6 are impossible. A valid example with three concurrent operations (OP1, OP2 and OP3) is shown below and reflects a possible text format for the state of the controller nodes CN0 . . . CN6.

OP1: CN1=CN0
OP2: CN3=CN6(CN2)
OP3: CN5=CN4
Next_Command;

OP2 states that the origin data (CN2) goes via the processing core 27 (CN6). The processing core 27 has no means for storing the data and therefore it cannot be an end point or result. If a valid core process includes an addition operator then the following could be valid:

$$CN3=CN6(CN2+CN0)$$

Despite similarities with computer languages, these methods are in fact merely means of describing and setting the hardware elements. An understanding of the hardware architecture is still required. For example, the following operation is not valid for the FFT engine:

$$CN3=CN6(CN1+CN2+CN0)$$

because the processing core 27 has only two inputs. In general, core processes can be of high complexity with multiple inputs and phases, but these can always be broken down into equation style commands. Other board designs may comprise many storage and processing controllers, and could be set in this manner:

$$CN5=CN3=CN6\_CORE \qquad (CN1+CN2)$$
$$*CN7\_ANOTHER\_CORE(CN0)$$

Operations that do not conflict with each other can take place concurrently and can be placed within command lines 31, 32. Take the following example:

OP1: CN2=CN6(CN0, CN1)
OP2: CN5=CN4
OP3: CN4=CN2

It can be seen that OP1 and OP2 can be executed in parallel, but that OP3 requires some resources that are already required by OP1 and OP2 (CN2 and CN4 respectively). OP3 must therefore wait until these resources are free.

Command lines give a convenient way of grouping processes that will always be executed in parallel. An error should be given if a command line comprising conflicting resources is programmed. In the above case, two command lines can be defined:

CL1: OP1; OP2
CL2: OP3

Note that command lines are only introduced to optimize the execution of the operations within a network or hardware board 5. Further, it is easy to see that one command line can contain as many operations as can be executed in parallel by the network or hardware board 5.

Now we introduce another hierarchy that takes the scheduling of command lines into account Note that there is a basic difference between executing CL1 before or after CL2. In the first case OP1 generates data and stores it in CN2, and in parallel CN4 is read, before OP3 transfers the data from CN2 to CN4. In the second case, data is first transferred from CN2 to CN4 by OP3, and then new data is generated by OP1 and stored in CN2, and in parallel CN4 is read by OP2. Both orders may be as valid, but will produce different results.

The operations in command lines CL1 and CL2 are illustrated using the FFT board configuration as shown in FIG. 3A and 3B, which is analogous to the board configuration of FIG. 1.

To uniquely define the order of operations, control vectors 30 are introduced. A control vector 30 contains one or more command lines 31, 32, which are executed in determined order. For example, for the two cases described above we can construct two control vectors 30:

CV1: CL1; CL2
CV2: CL2; CL1

Thus, referring to the example above, CV1 executes first the operations shown in FIG. 3A: Input data from input interface 21 and data from first memory 22 is transferred to the processor 27. After processing, the result is stored in second memory 23. At the same time, data is transferred from the fourth memory 25 to the output interface 26. After that, the operation of FIG. 3B is executed data is read from second memory 23 to processor 27, processed, and stored in the fourth memory 25.

Control vector CV2 executes first the operation of command line CL2 (FIG. 3B) and then the operations of command line CL1 (FIG. 3A).

An additional feature of control vectors 30 is the possible construction of "loops". Assume that the command lines CL1 and CL2 are to be executed in a repetitive way, say:
CV3: CL1; CL2; CL1; CL2; CL1; CL2; CL1;—

The control vector CV3 can be very long. Therefore we need only include enough command lines until the whole cycle repeats. To repeat a whole control vector CV3, only a signal needs to be present to indicate to do this and not the whole control vector CV3 once more. This can e.g. be implemented by sending e.g. 8 bytes of zero after a control vector CV3 to the control instruction decoder 12. When detecting such a special code in place of an expected control vector, the control instruction decoder 12 will then control the controller nodes CN0–CN6 in the proper manner.

Until this far it has been described how data "manipulations" and "transfers" can be controlled efficiently, but it was not mentioned how the properties of the data itself are described. An extension to the arithmetic is now introduced at control vector level, which we explain using an example with control vector CV1 and the FFT engine board configuration.

CL1 describes two operations OP1 and OP2. Operation OP1 has two data inputs (corresponding to INP and MEM1), and one data output (corresponding to MEM2). Operation OP2 has one data input (corresponding to MEM4) and one data output (corresponding to OUT). Similarly, CL3 describes the operation OP3, which has one data input (corresponding to MEM2), and one data output (corresponding to MEM4). This is illustrated as an input-output relation in FIG. 2.

As is shown in the figure, a unique argument is assigned to each input and output data of CV1. Each argument contains a list of all relevant properties of the corresponding data (such as data-format, number of data samples, location in memory, etc.). Note that each time a control vector 30 CV1 is executed, arguments may contain different properties (such as a different location in memory). Now a complete data transfer is described as a control vector followed by an argument list:

CV1 arg0 arg1–arg6

A complete program, also referred to as a transferlet, is a list of control vectors, including the corresponding argument lists. Here an (arbitrary) example of a transferlet is given:

transferlet
    CV1 arg0 arg1–arg6
    CV2 <argument list>
    CV3 <argument list>
    CV2 <argument list>
    CV4 <argument list>

Data flow from one group of controllers CN0–CN6 to another (e.g. from the board 5 to another hardware board) can be achieved using a system based around transferlets. These form linked list transfers based on the control vectors 30 and the inputs and outputs that these contain.

The above described method is particularly suited for setting the parameters for any data-driven controller based system. This could be a single board as described in the FFT engine 5 example, or a complete network. In the case of a complete network, a source and sink may well be other machines which are remote from each other and the parameters for these "controllers" could be programs or routines on these.

Preferably, the control vector 30 is programmed by an operator wishing to set a certain function for the hardware board 5 using a normal text editor. This has proven to be working effectively and efficiently. This text file can than be transformed into commands readable by the control instruction decoder 12, e.g. in a sort of machine language. This may be achieved using a compiler, using compiling techniques which are known as such. In the compiler, various levels of checks on parameters may be present, e.g. to ensure that memory banks (such as memories 22–25) are not exceeded, that controller nodes only occur once within a single command line (parallel execution). It may also be checked whether the data format is congruent throughout the operations OP. The result of the compiler may be a binary file or binary buffer comprising the settings of all hardware elements 21–27 in the form as described above. This binary file or binary buffer may be transferred to the hardware board 5 (indicated by the top arrow in FIG. 1), where the control instruction decoder 12 decodes the control vectors and sets the controller nodes 14–20 in sequence.

Minor modifications of the hardware elements 21–27 of the controller based hardware, such as interface modifications, can easily be added in the form of plug-ins. Plug-ins do not reflect major changes in the hardware architecture, but simply add or alter certain controller node parameters.

For the user wishing to program the controller based hardware board 5 and use in combination with further hardware, a Data Transfer Sequencer is a companion tool for simple construction and handling of linked list data transfers between the board 5 and other devices. A typical control vector 30 will require the transfer firstly of itself to the board 5, followed by some data input, followed by reading data back from the board 5. The sequence and size of the data transfers must correspond to the details contained within the control vector 30 itself. The set-up phase of the Data Transfer Sequencer takes a simple text file describing any number of transfers by name, plus the binary file or buffer mentioned above and produces any number of linked list transfers that can be started individually by referring to the given name and the handle for the particular set-up. An example is given below:

define_input_buffer mydata 2
define_input_buffer mywindow 1
define_output_buffer myresult 2
define_transfer fft2D
control_vector 3 mywindow 0
control_vector 4 mydata 0 myresult 0
control_vector 4 mydata 1 myresult 1
end_transfer The set-up phase of the data transfer sequencer checks that control vector 4 does indeed require one input and one output, and control vector 3 only an input. The lengths are calculated from the control vectors. The numbers after the buffer names state the offsets in units of data block lengths.

The user must pass his buffer pointers to the relevant set-up handle before calling a StartTransfer function. Pointers can later be moved to offer an alternative form of incrementing.

StartTransfer functions can also be called with an extra flag as to provide a child thread and therefore permit parallel processing. Polling on the status of the flag from the main thread indicates when the complete linked list transfer is complete.

Decoding the binary buffer or file in the same manner as the data transfer sequencer, a controller based hardware Development Kit in the form of a GUI allows the user to view a graphic representation of the operations on the board 5. When I/O speeds are entered, timing details can also be displayed. It is also possible to build in software emulation of the board 5 itself, such as a co-processor. Controller based hardware lends itself to simulation and emulation due to its close similarities with object-orientated design.

It is foreseeable that an extension of this would be a graphical means of designing algorithms and scripting the text files.

Controller based hardware can provide an efficient compromise between the flexibility of DSPs and the performance of fixed solutions. The present invention offers a powerful and flexible, yet clear and straightforward text and compiler-based method for setting and/or controlling this type of hardware. Although for the user a knowledge of the hardware architecture is required, this is not difficult to obtain and the compiler gives informative warnings and errors. The syntax is not dissimilar to those of popular mathematical software packages, such as MATLAB. For the controller based hardware developer, the compiler can be easily modified and developed to suit. Minor customisations can be handled in the form of special "Plug Ins". Overall, the flexibility, simplicity and error checking of this method can dramatically reduce user development and debugging time.

The companion Data Transfer Sequencer-software greatly simplifies the handling of data transfers between devices, taking the majority of its information from the compiled data, and only requiring brief text description of the required transfers. Like the compiler it greatly reduces the chances of deadlocks, incorrect transfer sequences, and the need to have any device driver and multithreading knowledge.

A GUI Development Kit can be easily made for controller based hardware, can incorporate a compiler, and further simplifies algorithm design and debugging.

The invention claimed is:

1. A method for setting controller based hardware including a plurality of hardware elements, the method including the steps of:
    receiving control data for a specific one of the hardware elements; and
    communicating that control data to the associated hardware element, wherein;
    the control data includes at least one control vector;
    the at least one control vector includes at least one command line and an indication of the scheduling of the at least one command line;
    the at least one command line includes at least one operation which may be executed in parallel on the controller based hardware; and
    the at least one operation includes a description of data flow between selected ones of the hardware elements.

2. The method according to claim 1, wherein the control data further includes a data argument list for the at least one control vector, the data argument list including data parameters for the at least one operation.

3. The method according to claim 2, wherein the data parameters include at least one of the following type of data: data format, number of data samples, data length, and address location.

4. The method according to claim 1, wherein each of the plurality of hardware elements is controllable as a source element for outputting data, a sink element for receiving data, a processing element for processing data or as an idle element.

5. The method according to claim 1, wherein the method includes repeating the execution of the control vector after receiving a repeat code.

6. The method according to claim 1, wherein the control data includes a transferlet, the transferlet including a plurality of control vectors and associated data argument lists.

7. The method according to claim 1, wherein each hardware element includes at least one of an input element, an output element, a read and/or write accessible memory element, and a processing element.

8. A controller based hardware device including:
a plurality of hardware elements;
a controller node for each of the plurality of hardware elements for controlling the associated hardware element; and
a control instruction decoder, the control instruction decoder being arranged for receiving control data for a specific one of the hardware elements and communicating that control data to the associated hardware element, wherein the control data includes at least one control vector, the at least one control vector includes at least one command line and an indication of the scheduling of the at least one command line, the at least one command line includes at least one operation which may be executed in parallel on the controller based hardware, and the at least one operation includes a description of data flow between selected ones of the hardware elements.

9. The controller based hardware device according to claim 8, wherein the control instruction decoder and controller node are implemented in at least one field programmable gate array.

10. The controller based hardware device according to claim 8, wherein the control data further includes a data argument list for the at least one control vector, the data argument list including data parameters for the at least one operation.

11. The controller based hardware device according to claim 8, wherein the data parameters include at least one of the following type of data: data format, number of data samples, data length, and address location.

12. The controller based hardware device according to claim 8, wherein each of the plurality of hardware elements is controllable as a source element for outputting data, a sink element for receiving data, a processing element for processing data or as an idle element.

13. The controller based hardware device according to claim 8, wherein the control instruction decoder repeats executing the control vector after receiving a repeat code.

14. The controller based hardware device according to claim 8, wherein the control data includes a transferlet, the transferlet including a plurality of control vectors and associated data argument lists.

15. The controller based hardware device according to claim 8, wherein each hardware element includes at least one of an input element, an output element, a read and/or write accessible memory element, and a processing element.

* * * * *